United States Patent
Katagiri et al.

(10) Patent No.: US 8,232,712 B2
(45) Date of Patent: Jul. 31, 2012

(54) SMALL ELECTRON GUN

(75) Inventors: Soichi Katagiri, Kodaira (JP); Takashi Ohshima, Higashimurayama (JP)

(73) Assignee: Hitachi I High-Technologies Corporation, Tokyo (JP)

( * ) Notice: Subject to any disclaimer, the term of this patent is extended or adjusted under 35 U.S.C. 154(b) by 0 days.

(21) Appl. No.: 12/461,195

(22) Filed: Aug. 4, 2009

(65) Prior Publication Data

US 2009/0289186 A1    Nov. 26, 2009

Related U.S. Application Data

(63) Continuation of application No. 11/806,196, filed on May 30, 2007, now abandoned, which is a continuation of application No. 10/873,358, filed on Jun. 23, 2004, now Pat. No. 7,238,939.

(30) Foreign Application Priority Data

Sep. 10, 2003  (JP) ................................. 2003-317703
Apr. 6, 2004   (JP) ................................. 2004-111682

(51) Int. Cl.
*G01N 23/225* (2006.01)

(52) U.S. Cl. ......... 313/310; 313/409; 250/310; 250/311
(58) Field of Classification Search .................. 313/409, 313/414, 549, 440–441, 421, 433; 335/209–213, 335/299, 302, 306; 348/828–830; 250/310, 250/423 F, 492.21, 492.1, 492.3, 311
See application file for complete search history.

(56) References Cited

U.S. PATENT DOCUMENTS

| 4,833,362 | A  | 5/1989  | Crewe |
| 5,059,859 | A  | 10/1991 | Endo et al. |
| 5,399,860 | A  | 3/1995  | Miyoshi et al. |
| 6,509,564 | B1* | 1/2003  | Suzuki et al. ................. 250/310 |
| 6,949,752 | B2 | 9/2005  | Okura et al. |
| 2005/0052103 | A1 | 3/2005 | Katagiri et al. |

FOREIGN PATENT DOCUMENTS

| JP | 48-25650  | 7/1951 |
| JP | 63-032846 | 7/1986 |
| JP | 63-202832 | 2/1987 |

(Continued)

OTHER PUBLICATIONS

Office Action from the Japanese Patent Office dated Mar. 24, 2009.

(Continued)

*Primary Examiner* — Karabi Guharay
*Assistant Examiner* — Elmito Breval
(74) *Attorney, Agent, or Firm* — Stites & Harbison, PLLC; Juan Carlos A. Marquez, Esq

(57) ABSTRACT

To provide a small electron gun capable of keeping a high vacuum pressure used for an electron microscope and an electron-beam drawing apparatus. An electron gun constituted by a nonevaporative getter pump, a heater, a filament, and an electron-source positioning mechanism is provided with an opening for rough exhausting and its automatically opening/closing valve, and means for ionizing and decomposing an inert gas or a compound gas for the nonevaporative getter pump. It is possible to keep a high vacuum pressure of $10^{-10}$ Torr without requiring an ion pump by using a small electron gun having a height and a width of approximately 15 cm while emitting electrons from the electron gun.

6 Claims, 9 Drawing Sheets

FOREIGN PATENT DOCUMENTS

| | | |
|---|---|---|
| JP | 63-291348 | 5/1987 |
| JP | 3-505386 | 4/1989 |
| JP | 3-84839 | 8/1989 |
| JP | 2000-149850 | 6/1990 |
| JP | 4-215240 | 12/1990 |
| JP | 6-111745 | 9/1992 |
| JP | 6-275218 | 3/1993 |
| JP | 6-188294 | 5/1993 |
| JP | 7-230778 | 2/1994 |
| JP | 8-022787 | 7/1994 |
| JP | 2000-294182 | 4/1999 |
| JP | 2001-325912 | 5/2000 |
| JP | 2005-108806 | 4/2004 |

OTHER PUBLICATIONS

Office Action from the Japanese Patent Office for patent application No. P2004-111682 dated on Nov. 25, 2008 in English.

* cited by examiner

SMALL ELECTRON GUN

CROSS-REFERENCE TO RELATED APPLICATION

This application is a Continuation of U.S. application Ser. No. 11/806,196 filed May 30, 2007 now abandoned, which is a Continuation of U.S. application Ser. No. 10/873,358 filed Jun. 23, 2004 now U.S. Pat. No. 7,238,939. This application claims priority to U.S. application Ser. No. 11/806,196 filed May 30, 2007, which claims priority to U.S. application Ser. No. 10/873,358 filed Jun. 23, 2004, which claims priority to Japanese Patent Application Nos. 2003-317703 and 2004-111682 filed on Sep. 10, 2003, and Apr. 6, 2004, respectively, all of which is incorporated by reference.

BACKGROUND OF THE INVENTION

1. Field of the Invention

The present invention relates to an electron gun of an electron microscope or electronic drawing apparatus, particularly to downsizing of an electron gun.

2. Discussion of Background

A conventional scanning electron microscope (SEM) or electron-beam drawing apparatus (EB) accelerates an electron beam emitted from an electron gun constituted by a field-emission or thermal-field-emission electron source, forms the electron beam into a thin electron beam by an electron lens, forms the thin electron beam into a primary electron beam, thereby scans the surface of a sample with the primary electron beam by an electronic deflector to obtain an image by detecting obtained secondary electrons or reflected electrons when the SEM is used or to draw a previously entered pattern on a resist film applied onto the sample when the EB is used. The material of the electron source uses tungsten when a general-purpose SEM is used. Moreover, an electron source for semiconductor may use a material obtained by adding zirconium to tungsten. Furthermore, $LaB_6$ may be used for the EB.

To emit a preferable electron beam from the above electron source for a long time, it is necessary to keep the circumference of an electron source at a high vacuum pressure ($10^{-9}$ to $10^{-10}$ Torr). Therefore, a method has been used so far in which the circumference of an electron gun 16 is forcibly exhausted by an ion pump 13, as shown in FIG. 2. The ion pump 13 has an advantage in that it is possible to keep a pressure of $10^{-10}$ Torr or lower only by current-carrying because the pump has no movable part. However, because the ion pump 13 has a size of tens of centimeters square or more and generates a magnetic field, the pump 13 requires a considerable volume because a magnetic shield 15 is necessary for the electron gun side.

Paragraph 0033 of JP-A No. 149850/2000 discloses a charged particle beam apparatus having a built-in getter ion pump in a lens tube as means for downsizing an electronic optical system. Moreover, a charged particle beam apparatus having a built-in nonevaporative getter pump in an electron gun chamber is disclosed in FIG. 3 of U.S. Pat. No. 4,833,362; Paragraph 0033 of JP-A No. 149850/2000; and FIG. 2 of JP-A No. 111745/1994. The getter pump mentioned above means a vacuum pump for activating and evaporizing a getter by heating it and adsorbing impurities into the getter. Moreover, the nonevaporative getter pump denotes a vacuum pump constituted by using an alloy for adsorbing gas by only heating a getter without evaporating it. From the viewpoint of downsizing, it is more preferable to use the nonevaporative getter pump.

Furthermore, Paragraph 0014 of JP-A No. 294182/2000 discloses an electron gun in which an axis adjustment screw for adjusting the axis of an electron source is installed on the circumference of a flange. Further, JP-A No. 188294/1994 discloses a charged particle apparatus having a differential exhausting structure for keeping the circumference of an electron source at an ultrahigh vacuum pressure in its FIG. 9. Further, JP-A No. 325912/2001 discloses a technique for improving the exhausting efficiency of a vacuum chamber by making a hydrocarbon-based gas remaining in a sample chamber react with active oxygen introduced into the sample chamber and thereby decomposing the gas and active oxygen into water and carbon dioxide, which are easily exhausted.

SUMMARY OF THE INVENTION

It has been recognized that what is needed is a high vacuum pressure of between about $10^{-9}$ to $10^{-10}$ Torr when using a field-emission electron gun. Accordingly, a dedicated ion pump 12 is provided to exhaust an electron-gun column 10, as shown in FIG. 1.

However, with conventional methods, it is difficult to downsize an ion pump because the pump has a large size and a magnetic field leaks and it is necessary to set the ion pump by keeping a certain distance from an electron gun as shown in FIG. 2.

Moreover, a method may be used in which the housing of an ion pump is formed like a doughnut so as to be coaxial with an electron-gun column. However, because the diameter of the ion pump housing is at least approximately tens of centimeters, there is a limit in downsizing the ion pump.

By using a nonevaporative getter pump, it may be possible to theoretically downsize an electronic optical system. However, when using the nonevaporative getter pump, it is difficult to exhaust a rare gas such as helium or argon and a chemically stable gas such as methane, it is impossible to substantially keep a high vacuum pressure, and thus the pump is not practically used yet. It is necessary that gas has a micro potential for absorption. However, when using a chemically stable gas such as a rare gas or fluorocarbon gas, it is difficult to exhaust the gas because it is completely equilibrium.

Moreover, when operating an electron source, some of discharged electrons hit components of an electron gun and thereby, miscellaneous gases are discharged. Thus, a vacuum pressure is deteriorated and resultantly, a problem occurs that the service life of the electron gun is shortened. Particularly, when the volume of an electron gun is decreased by downsizing the gun, a problem occurs that the total pressure of the above rare gas rises and the trend that a vacuum pressure is deteriorated becomes remarkable even if the partial pressure of the gas is low.

To address the problems of conventional methods, it is an object of the present invention to provide an electron gun which is able to keep a high vacuum pressure even while emitting an electron beam and smaller than a conventional one. It is another object of the present invention to provide an electron microscope or an electron-beam drawing apparatus on which the small electron gun is mounted.

The present invention attains the above objects using an electron source, a vacuum vessel for holding the electron source, a getter pump set in the vacuum vessel, an opening for exhausting the vacuum vessel, and decomposing device for decomposing a gas produced while the electron source operates.

By using the present invention, it is possible to obtain an electron microscope or an electron-beam drawing apparatus capable of keeping a high vacuum pressure of approximately $10^{-10}$ Torr without using an ion pump.

The invention encompasses other embodiments of a system, an apparatus, and a method, which are configured as set forth above and with other features and alternatives.

BRIEF DESCRIPTION OF THE DRAWINGS

The present invention will be readily understood by the following detailed description in conjunction with the accompanying drawings. To facilitate this description, like reference numerals designate like structural elements.

DESCRIPTION OF THE PREFERRED EMBODIMENTS

Embodiments of an invention for an electron microscope or an electron-beam drawing apparatus having a small electron gun that may be implemented to maintain a high vacuum pressure are disclosed. Numerous specific details are set forth in order to provide a thorough understanding of the present invention. It will be understood, however, to one skilled in the art, that the present invention may be practiced with other specific details.

First Embodiment

Figure 1:
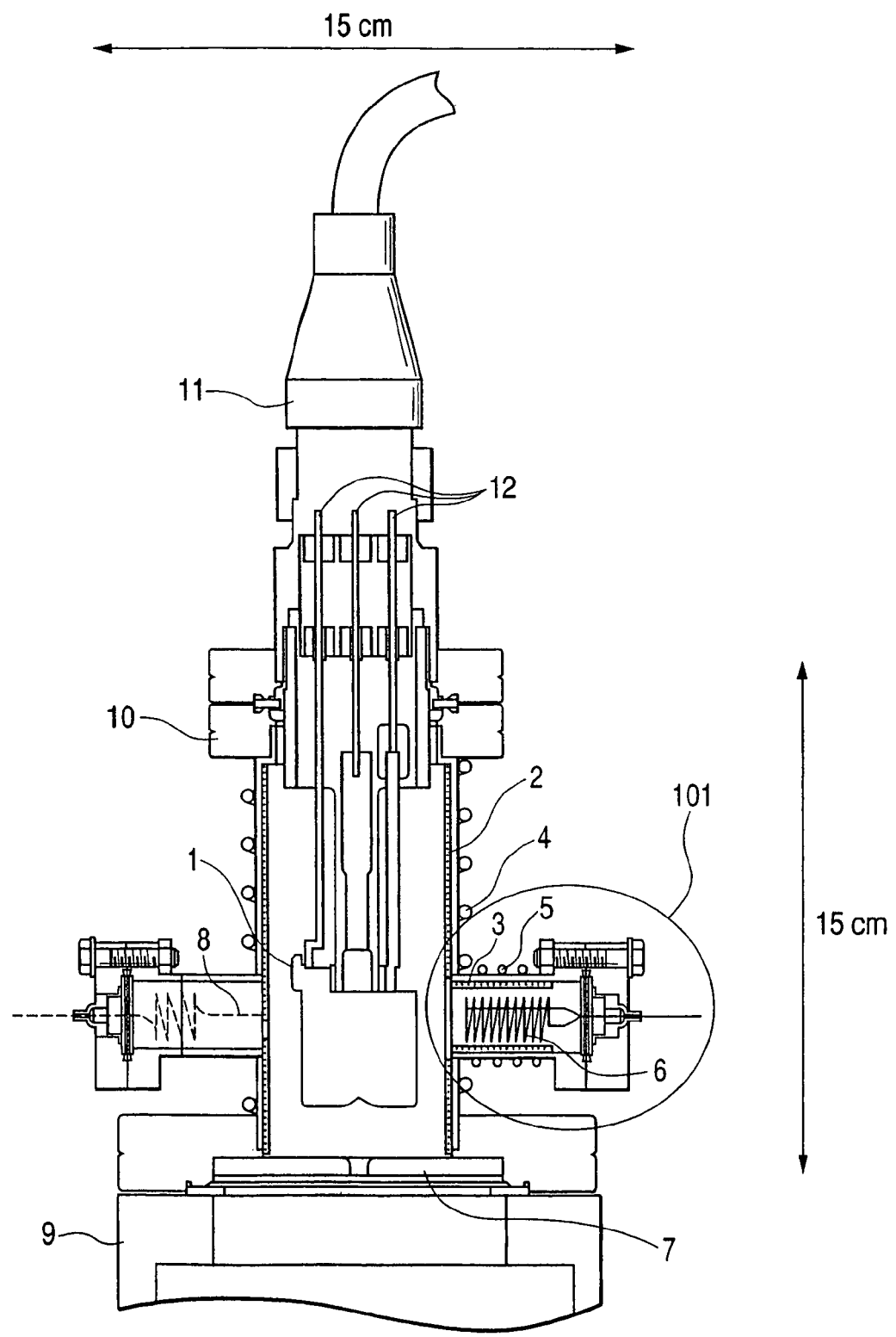
FIG. 1 explains an electron gun, in accordance with an embodiment of the present invention.
Figure 2:
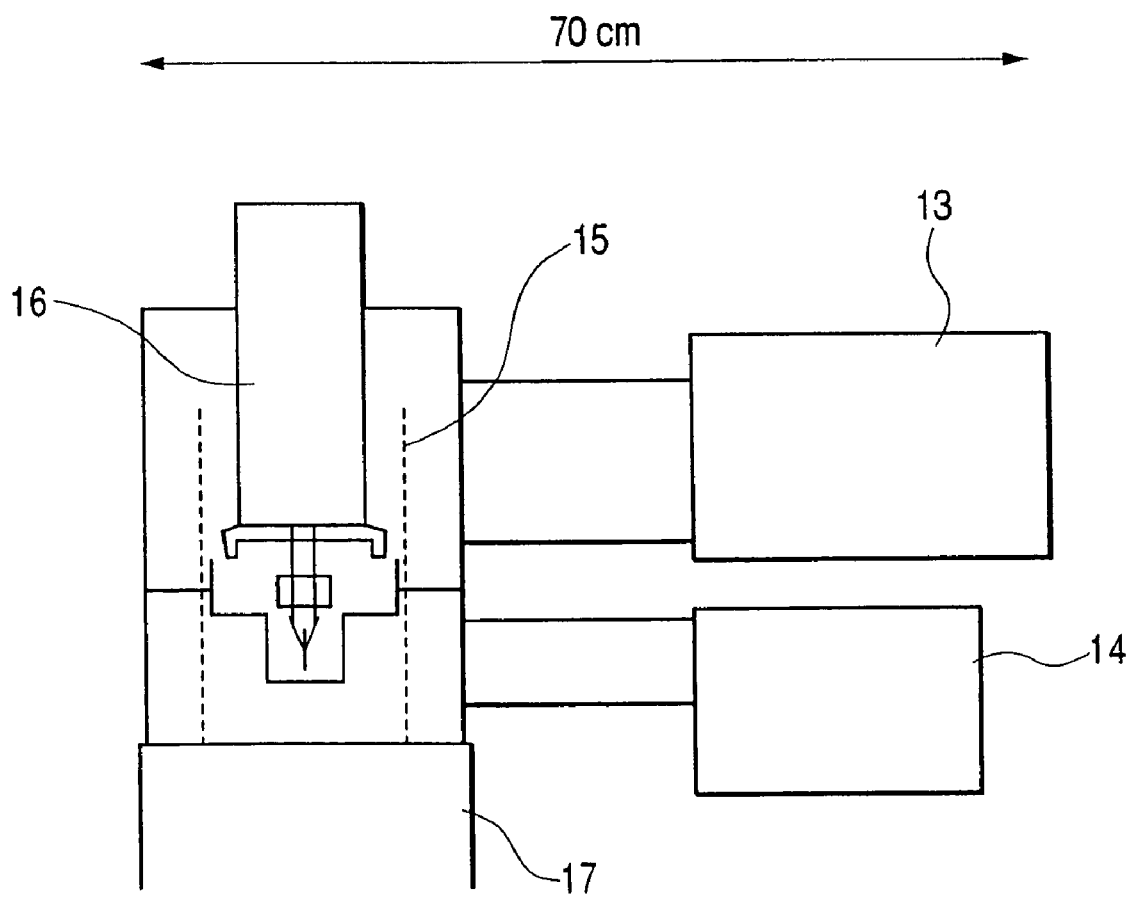
FIG. 2 explains a configuration of a prior art electron gun.

FIG. 1 shows a configuration of an electron gun of this embodiment. An electron source uses a thermal-field-emission electron gun (TFE) 1. The electron source 1 is set to the flange of an ICF 70 and connected with an introduction terminal 12 to an electrode (suppressor, drawer, or chip) (not shown). The electron source 1 is inserted into and fixed to an electron-gun column 10.

The inside diameter of this column is approximately 37 mm. The column 10 has a sheeted nonevaporative getter pump 2 along the inside diameter. The nonevaporative getter pump 2 is activated when overheated to take in air. Therefore, a first heater 4 is set to the outside of the electron-gun column 10. This embodiment uses the heater 4 by winding a sheath heater on the electron-gun column 10. Note that a nonevaporative getter-pump heating device may be set in the vacuum vessel, in other words, the electron-gun column 10. A thermocouple 8 is set to a side face of the electron-gun column 10 to monitor a heating temperature of the nonevaporative getter pump 2. This embodiment uses a nonevaporative getter pump to be activated at 400° C. for 10 min.

A pump section 101 provided with an ionizing function is connected to a part of the housing of the electron-gun column 10. A filament 6 for decomposing miscellaneous gases produced while an electron gun emits an electron beam is set in the pump section 101 provided with the ionizing function. The pump section 101 provided with the ionizing function may be set to the housing of the electron-gun column 10 as a special component or as a part of the housing of the electron-gun column 10. An internal configuration of the pump section 101 provided with the ionizing function will be described later.

Operations of components of an electron gun are described below. When the electron source 1 emits electrons, some emitted electrons hit components to discharge gas containing hydrocarbon. When the volume of an electron-gun column is small and forcible exhausting is not performed by an ion pump, like the case of this embodiment, hydrocarbon gas is not exhausted by the nonevaporative getter pump 2. Therefore, there is a problem that the vacuum pressure in an electron gun is deteriorated to affect the electron source 1.

Accordingly, the ionizing-function-provided pump section 101 provided with the filament 6 made of tungsten is set to a side face of the electron-gun column 10. The filament 6 is used to thermally ionize and decompose the hydrocarbon (mainly, methane) in the electron-gun column 10 into carbon and hydrogen. That is, by adding a device for thermally ionizing and decomposing the hydrocarbon which cannot be exhausted by a nonevaporative getter pump to an electron gun, it is possible to exhaust the hydrocarbon. The ionizing-function-provided pump section 101 is set to the housing of the electron-gun column 10 by forming an opening on the housing. A second nonevaporative getter pump is set to the inner wall surface of the ionizing-function-provided pump section 101 to adsorb ionized and decomposed hydrocarbon gas. Thus, by setting the second nonevaporative getter pump nearby the filament, the exhausting efficiency is further improved. A second heater 5 is set to the outside of the housing of the ionizing-function-provided pump section 101 in order to overheat the second nonevaporative getter pump. To prevent an electron gun from overheating, it is preferable to turn off the first heater for heating the housing of an electron-gun column while an electron gun emits an electron beam. Therefore, by setting the second heater set to the ionizing-function-provided pump section 101 separately from the first heater, it is possible to heat the second nonevaporative getter pump even while an electron gun emits an electron beam. That is, it is possible to exhaust only the circumference of a hydrocarbon-gas producing source.

Because an opening 7 is formed below the electron gun 1, emitted electrons pass through the opening 7 and are led to an electronic optical system set in a column 9 for the electronic optical system. Because the vacuum pressure in an electronic optical system column is generally lower than the vacuum pressure in an electron-gun column, the electronic optical system column and electron-gun column constitute a differential exhausting structure at both sides of the opening 7. Consequently, the above gas containing hydrocarbon may also enter the electronic optical system column through the opening 7. Therefore, an important function of the present invention for thermally ionizing hydrocarbon gas is to use a nonevaporative getter pump.

The orbit of an electron emitted from the electron source 1 may be influenced depending on an operation of the filament 6. Therefore, at a position below the electron emission position of the electron source 6 in the housing of the electron-gun column 10, an electron emitted from the electron source may be influenced by an operation of the filament 6. Thus, preferably a position to which the filament 6 or ionizing-function-provided pump section 101 is set or the position of an opening where the electron-gun column 10 is connected with the ionizing-function-provided pump section 101 is present at an upper portion of the electron-beam generating position of the electron source 1 (e.g., electron-beam takeout electrode).

A procedure for operating the electron gun of this embodiment is now described. First, to exhaust a sample chamber, rough exhausting is started from the atmospheric pressure by driving a vacuum pump (not shown). Then, baking is performed by heating the first heater 4 and second heater 5. At the initial stage of baking, a temperature is kept at approximately 200° C. to mainly bake water and hydrocarbon gas in a housing. By performing baking for 6 to 12 hr, the gas released from the inner-wall surface decreases up to a pressure which does not matter. Then, the nonevaporative getter pumps 2 and 3 are activated by increasing the power to be applied to the first and second heaters to bring a target temperature to 400 to 500° C. By keeping the temperature for approximately 10 to 20 minutes after temperature rise, the pumps 2 and 3 are sufficiently activated.

Exhausting and baking are performed by building up the electron gun to achieve a vacuum pressure of $10^{-10}$ Torr. Moreover, by applying 2 kV to the electron gun to emit electrons, a vacuum pressure of $10^{-10}$ Torr may be kept. Because a high vacuum pressure can be kept, a cold-cathode electron source (CFE) or a Schottky electron source may be used instead of the thermal-field-emission electron source used in this embodiment. It is also possible to greatly decrease rough dimensions of the whole electron gun. In the embodiment shown in FIG. 1, dimensions of the whole electron gun is reduced in size as small as a width of approximately 15 cm and a height of approximately 15 cm, compared to a conventional configuration.

To exhaust the electron-gun column 10 from the atmospheric pressure to a high vacuum pressure, a rough exhausting port may be set to the electron-gun column 10 when exhausting from the opening y is insufficient.

Second Embodiment

This embodiment describes the electron gun, described in the first embodiment, as applied to a scanning electron microscope.

Figure 3:
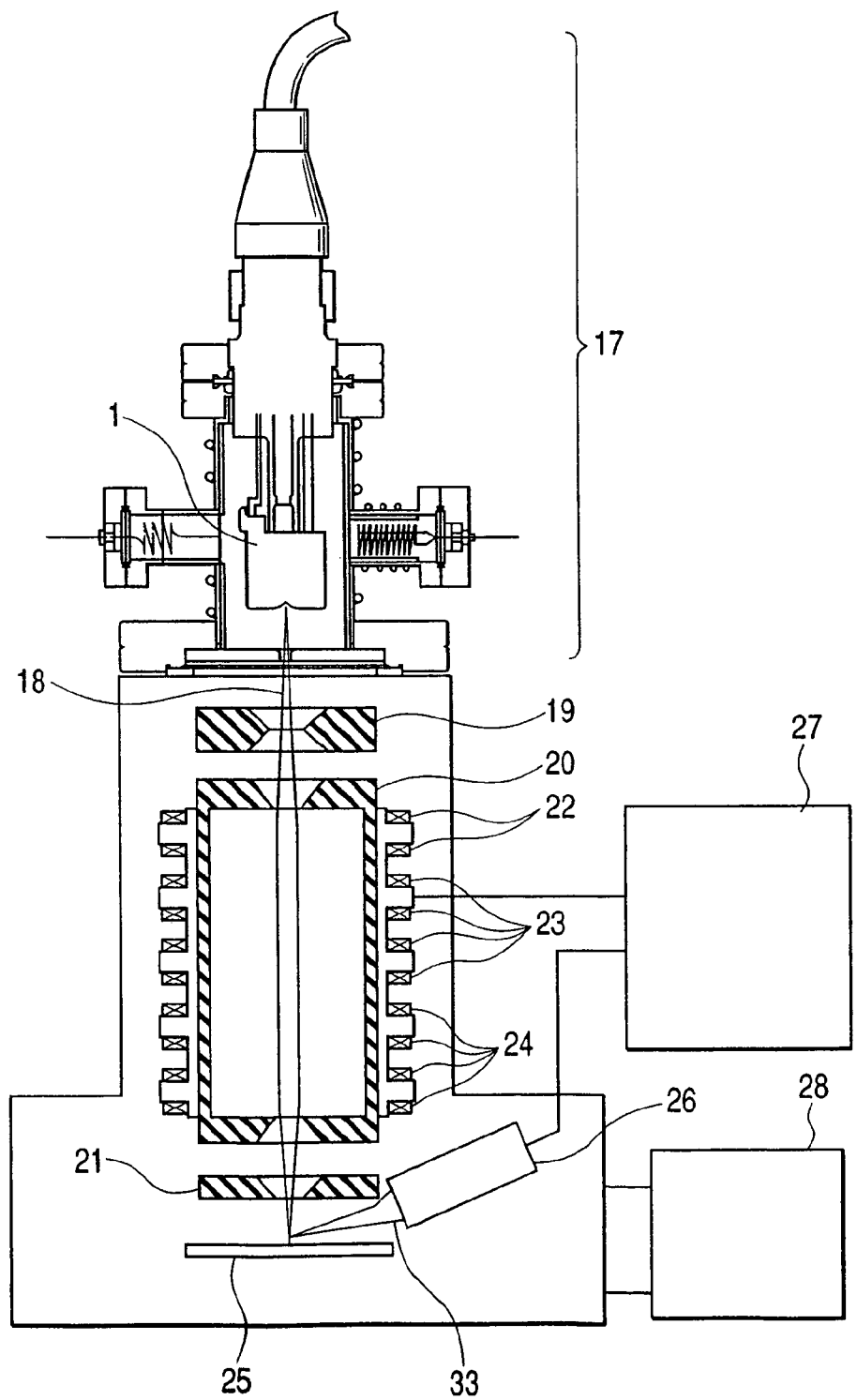
FIG. 3 is a schematic diagram of a scanning electron microscope, in accordance with an embodiment of the present invention.

FIG. 3 shows a schematic configuration of the scanning electron microscope of this embodiment. From the viewpoint of being advantageous for downsizing, every electronic optical system used in this embodiment uses a small electronic optical system constituted by an electrostatic lens. In FIG. 3, an electron beam 18 field-emitted from a field-emission electron gun 17 is thinly converged by electric fields formed between electrodes of an electrostatic lens set below the electron gun 17 and applied onto a sample 25. The electrostatic lens comprises a third lens electrode 19, a second lens electrode 20, and a first lens electrode 21.

At the same time, the electron beam 18 is deflected in the internal space of the second lens electrode 20 by a deflector 24 to two-dimensionally scan the surface of the sample 25. Moreover, to align the optical axis of the electron beam 18 with that of the electrostatic lens, the optical axis of the electron beam 18 can be shifted by an alignment coil 23.

Furthermore, to perform astigmatism correction of the electron beam 18, a stigma coil 22 is set. A secondary electron 33 generated from the sample 25 reaches a secondary-electron detector 26 and is detected. By supplying a detection signal of the electron 33 to image forming device 27, a two-dimensional secondary electron image on the surface of the sample 25 can be obtained.

This embodiment aims at the observation at a low acceleration voltage capable of decreasing the electrification or damage of the surface of a sample due to irradiation with an electron beam, so as to be suitable for surface observation of a semiconductor.

Therefore, the acceleration voltage Va of the electron beam 18 is set to 3 kV or lower (mainly, approximately 1 kV).

For the embodiment shown in FIG. 3, an electronic optical system is constituted by only an electrostatic lens. Therefore, an electro optic lens tube has a very small size such as an outside diameter of 34 mm and a height of 150 mm. Moreover, this embodiment realizes a high resolution (6 nm at an acceleration voltage of 1 kV). Furthermore, the electronic optical system is inserted into a vacuum vessel different from the vacuum vessel of the electron gun 17, both of which are located at both sides of an opening plate 7. The former vacuum vessel is kept in a vacuum state by a turbo-molecular pump. The opening plate 7 has an opening for leading an electron beam to the outside of the electron gun.

Advantageously, it is possible to realize a small high-resolution scanning electron microscope previously unheard.

Third Embodiment

This embodiment describes the electron gun, described in the first embodiment, as applied to an electron-beam drawing apparatus. To provide a pattern drawing function for the small scanning electron microscope described in the second embodiment, the microscope may be used as an electron-beam drawing apparatus.

Figure 4:
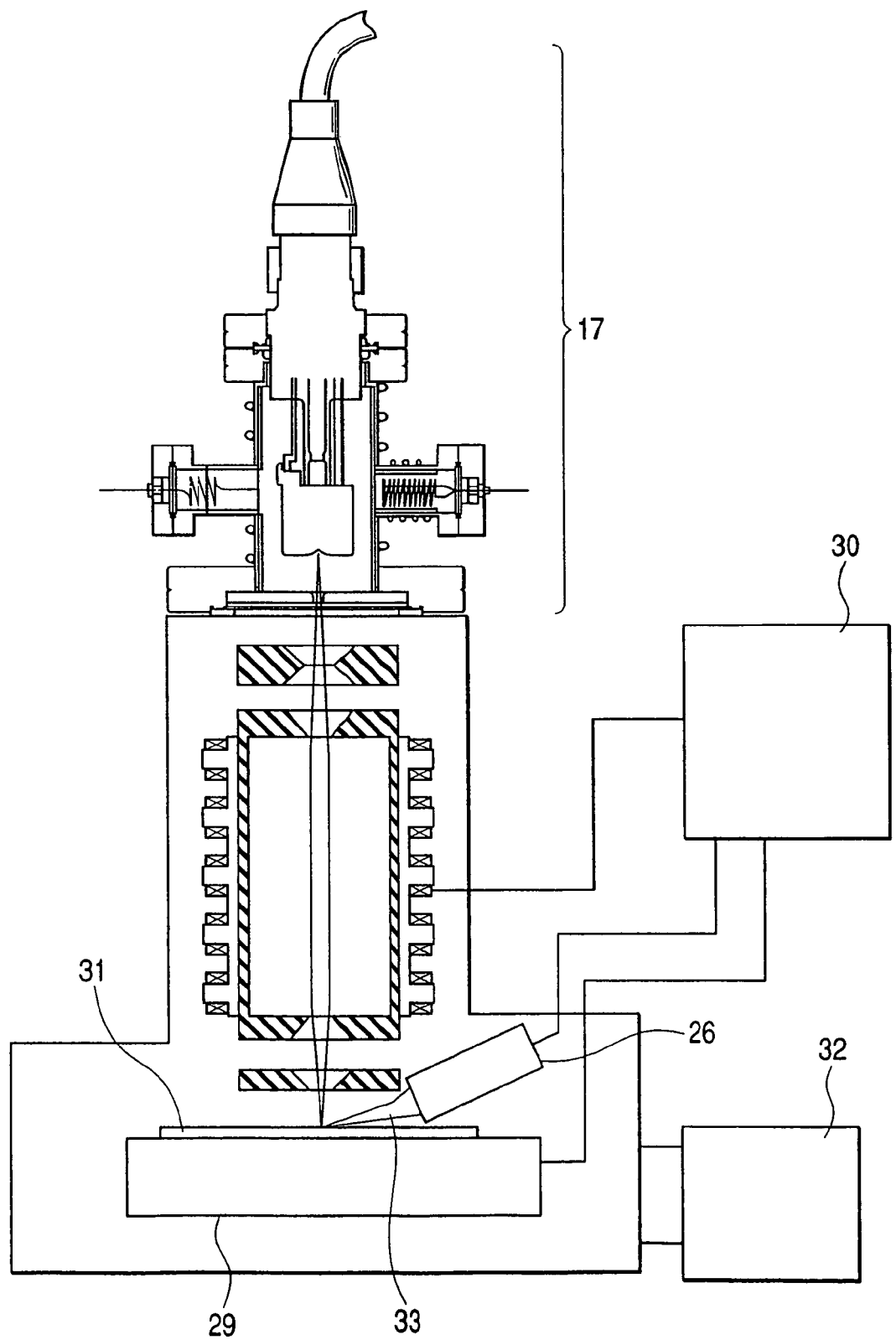
FIG. 4 is a schematic diagram of an electron-beam drawing apparatus, in accordance with an embodiment of the present invention.

FIG. 4 is a schematic diagram of an electron-beam drawing apparatus of the third embodiment. It is possible to draw a pattern having a resolution of 6 nm on a resist film applied onto a sample 31 by sequentially reading data from a pattern record control device 30, previously storing the data for the layout of a pattern and the like, and deflecting an electron beam 18 by a deflector 24 so as to form the pattern. Moreover, it is possible to detect the position of a pattern to be drawn by detecting a secondary electron beam 33 generated from a region nearby a positioning mark, not shown, by a secondary electron detector 26.

Because this embodiment uses an acceleration voltage at a low acceleration of approximately 1 kV, it is impossible to draw a pattern on a thick-film resist (1 μm or more). Therefore, this embodiment is suitable for a process for forming a pattern on the surface of a thin film resist (0.3 μm or less). As features, because the influence of a proximity effect can be lowered, it is possible to decrease the time for correction, greatly decrease an apparatus in size, and comparatively easily obtain high-resolution drawing.

Fourth Embodiment

This embodiment describes (1) a configuration of an electron gun having a positioning mechanism for optical axis alignment of an electron source and (2) an automatic change mechanism for rough exhausting and main exhausting when exhausting an electron-gun column.

When using an electron-beam-applied or charged-particle-beam-applied apparatus, it is obviously necessary to accurately perform optical axis alignment of an electron beam. However, when downsizing an electron gun or an apparatus mounting the electron gun, it is difficult to mount complex positioning device or optical-axis alignment device on an apparatus because downsizing is restricted.

Moreover, for exhausting of an apparatus, it is preferable to minimize the number of exhausting apparatuses used for the whole charged-particle-beam apparatus in order to decrease an apparatus in size. Accordingly, it is preferable to communize an exhausting device for an electronic optical system set below an electron gun and measuring optical system on which various detectors are arranged. Thus, it is an object of this embodiment to provide an electron gun having a positioning mechanism for a small electron source having a simple configuration and capable of accurately performing optical axis alignment of the electron gun. It is another object of this embodiment to provide and an automatic rough-exhausting and main-exhausting change mechanism capable of communizing rough exhausting device between an electron-gun column and an electronic-optical system column.

Figure 5:
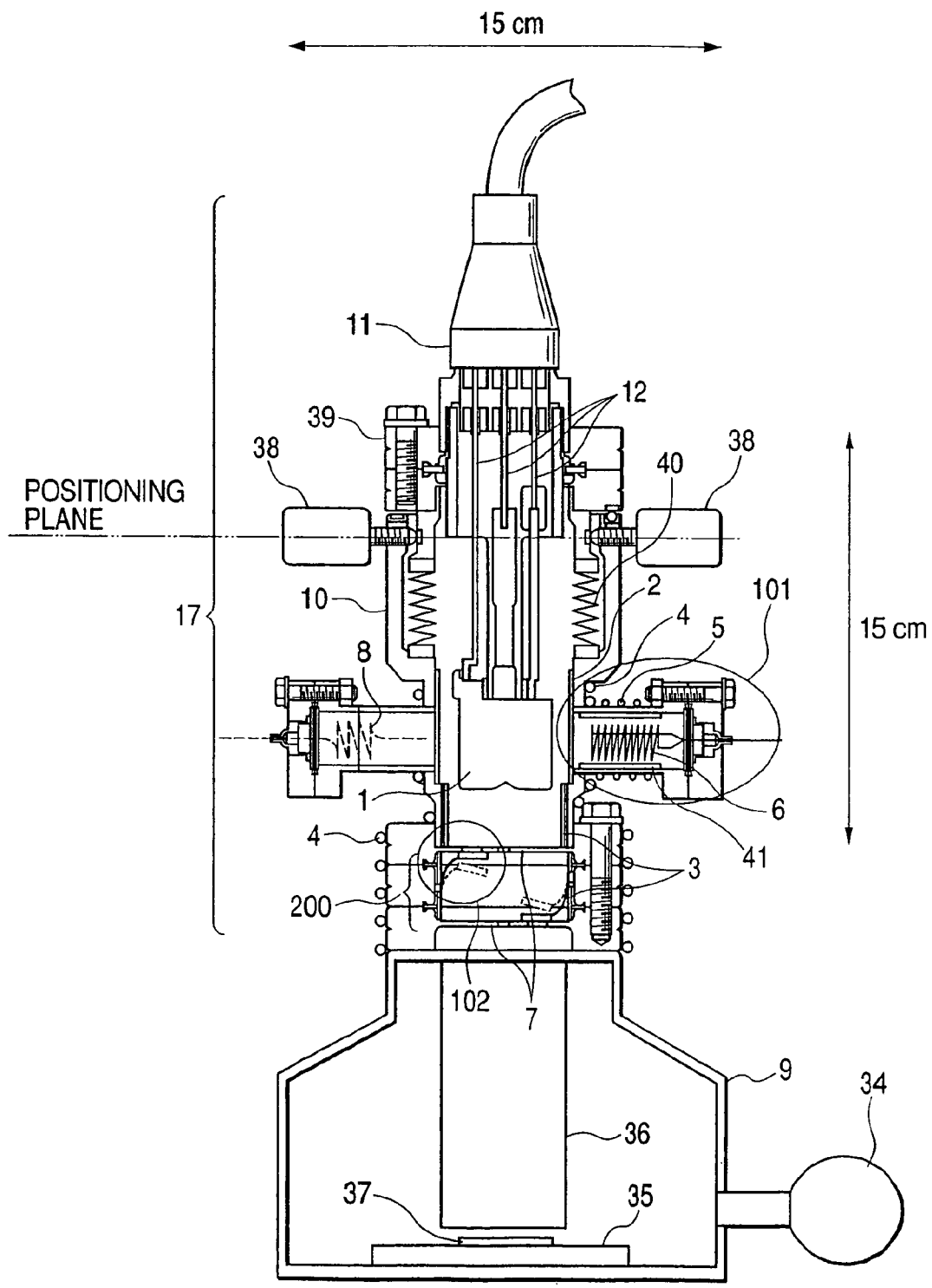
FIG. 5 is another configuration of an electron gun, in accordance with an embodiment of the present invention.

FIG. 5 shows a configuration of the electron gun 17 of this embodiment. Descriptions of portions common to those of the electron gun having the configuration shown in FIG. 1 such as the electron source 1, and ionizing-function-provided pump section 101 are omitted. The electron gun of this embodiment is different from the electron gun of the first embodiment in that the following are used: a positioning mechanism including a conflat flange 39 for fixing an electron source 1 to an electron-gun column 10, bellows 40, or a knob 39 having an adjusting screw at its front end and a differential exhausting section 200 having an automatically opening/closing valve 102 for rough exhausting. To actually constitute a charged-particle-beam apparatus, the electron gun 17 is combined with a column 9 and electronic optical system. The electronic-optical-system column 9 has an electronic-optical-system lens tube 36 storing a deflector and an objective and a sample table 35. The column 9 for an electronic optical system connects with a vacuum pump 34. Though not separately shown in FIG. 5, the vacuum pump 34 includes a rough-exhausting vacuum pump and a main-exhausting vacuum pump.

First, the configuration of a positioning mechanism of and operations of an electron gun are described below. To make an electron beam emitted from the electron source 1 efficiently pass through an opening, it is necessary to adjust the position of the electron source 1. Because the opening formed at the center of an opening plate 7 has a diameter of approximately 0.5 mm, it is necessary to realize a movement stroke of approximately 1 mm in a plane vertical to the optical axis. The electron source 1 is fixed to the conflat flange 39 having a diameter of 70 mm and various types of electric wires are connected through an electrode 12 in which the chip (not shown) and electrode (not shown) of the electron source 1 are formed in feed-through. In this case, the feed-through denotes an introducing section formed on a vacuum vessel to lead various types of electric wires into the vacuum vessel. These structures are connected to the electron-gun column 10 through the bellows 40. The electron source 1 is constituted so as to be able to move to the electron-gun column 10 by a distance equivalent to the deformation value of the bellows 40. A relative position between both is adjusted so that an electron beam transmitted to the electronic-optical-system column 9 is maximized while turning an electron-source positioning knob 38. FIG. 5 shows only one electron-source positioning knob. Actually, however, two knobs are paired facing each other. The knobs are provided in directions orthogonal to each other at the total of four places one pair by one pair. When the position of the electron source 1 is decided, it is possible to prevent a displacement by completely fastening and locking faced knobs.

The configuration and operations of the differential exhausting section 200 are described below. To exhaust the electron-gun column 11 from the atmospheric pressure up to a high vacuum pressure, exhausting from the opening 7 is insufficient. Therefore, because a port for rough exhausting has been set to the electron-gun column 10 so far, the external size has been increased. For the electron gun of the first embodiment, however, the opening formed on the opening plate 7 serves as a rough-exhausting port. Therefore, rough-exhausting device can be shared between the electron gun 17 and the electronic-optical-system column 9. Accordingly, it is possible to downsize an apparatus. However, the electron gun of the first embodiment has a problem that the diameter of a hole formed on the opening plate 7 is too small and the conductance for rough exhausting is too small. However, it is impossible to greatly increase the size of an opening formed on the opening plate 7. Because the vacuum pressure in the electronic-optical-system column 9 is lower than that in the electron-gun column 10, when extremely increasing the hole diameter on the opening plate 7, the gas remaining in the electronic-optical-system column 9 reversely flows into the electron-gun column 10. Consequently, it may be difficult to keep a high vacuum pressure.

Accordingly, for the electron gun of this embodiment, a rough-exhausting opening is formed on the opening plate 7 separately from an electron-beam-passing opening. Moreover, the automatically opening/closing valve 102 is set to the rough-exhausting opening.

The configuration and operations of the automatically opening/closing valve 102 for rough exhausting are described below in detail by referring to FIGS. 6A and 6B.

Figure 6A:
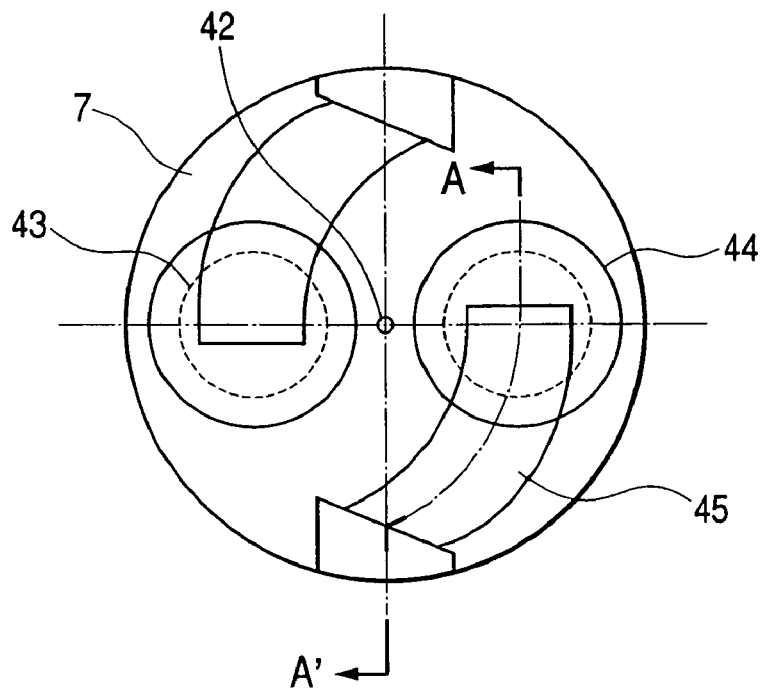
FIG. 6A is a top view of an opening plate using an automatically opening/closing valve, in accordance with an embodiment of the present invention.
Figure 6B:
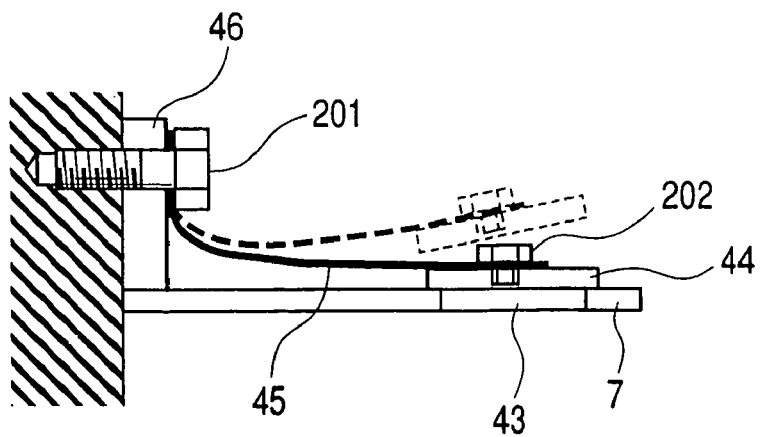
FIG. 6B is a cross-sectional view for explaining a structure of an automatically opening/closing valve, in accordance with an embodiment of the present invention.

FIG. 6A shows a top view of the opening plate 7 and FIG. 6B shows a sectional view of the opening plate 7 when cutting the position A-A' in FIG. 6A along the alternate long and short dash line shown in FIG. 6A. For the differential exhausting section 200 in FIG. 5, only one automatically opening/closing valve 102 is shown for one opening plate 7. Actually, however, two valves are added to one opening plate 7. The hatching at the left side in FIG. 6B denotes the inner wall surface of the differential exhausting section 200 (or electron-gun column 10). Symbol 46 denotes a fixing plate for fixing the opening plate 7 and a movable arm 45 to the inner wall surface. A first opening 42 through which an electron beam passes is formed at the center of the opening plate 7. A second opening 43 is formed separately from the first opening 42. Setting the hole diameter to a value larger than that of the opening 43 is effective because the conductance for rough exhausting increases. A lid 44 corresponds to the opening 43. The lid 44 is connected with the inner wall surface by an autonomously movable arm 45, which vertically moves on the basis of the inner wall surface. This embodiment uses a bimetal to be thermally deformed as the material of the arm

45. In this embodiment, the autonomously movable arm 45 is constituted by a bimetal to be thermally deformed.

However, it is also possible to obtain the same advantage by using a shape memory alloy. A bimetal generally uses a magnetic material such as a FeNi—NiFeCr alloy. When using a magnetic material for a movable arm, the orbit of an electron beam passing through the first opening 42 is bent. Therefore, it is preferable to use a bimetal made of a non-magnetic material for a movable arm. When considering the operation temperature of a nonevaporative getter, it is confirmed through experiments that preferably a bimetal has a high-temperature resistance. Particularly, it is preferable to use a bimetal obtained by combining a stainless alloy with a small thermal expansion metal such as tungsten.

To keep the air tightness of the electron-gun column 10, it is necessary that the lid 44 closely adheres to the opening plate 7 when main exhausting is performed. When considering the adhesiveness of the lid 44, preferably the lid 44 plastically deforms when it adheres to the opening plate. Therefore, the elastic modulus of a material constituting the lid 44 is preferably smaller than that of a material constituting the opening plate 7. Moreover, dirt may attach to the opening plate 7 because an electron beam passes through the central opening 42. Furthermore, the movable arm 45 and lid 44 may be deteriorated with time after repeating adhesion and opening operation with the opening plate 7. Accordingly, the opening plate 7, movable arm 45, and lid 44 must easily be replaced.

In this embodiment, the opening plate 7 and movable arm 45 are respectively fixed to the inner wall surface by a fixing screw 202. Accordingly, separately using a fixing device to fix the opening plate 7, lid 44, and movable arm 45 to the inner wall surface provides an electron gun in which the opening plate 7, movable arm 45, and lid 44 can easily be replaced. In FIG. 6B, because the movable arm 45 and opening plate 7 use the same fixing device, it is impossible to independently replace the movable arm and opening plate. However, using two fixing screws and thereby separately fixing the movable arm and opening plate to the inner wall surface realizes an electron gun in which the opening plate 7 and movable arm 45 can independently be replaced. Thus, it is possible to provide an electron gun that can be more easily maintained.

Moreover, to keep the air tightness between upstream and downstream sides of the opening plate 7, the opening plate 7 may be welded to the inner wall surface. Note that another component must be used for the opening 42 in order for the opening plate 7 to be replaceable.

A procedure for exhausting the electron gun of this embodiment and a charged-particle-beam applied apparatus is described below. Components for constituting the apparatus are assembled to execute exhausting. In this case, to activate nonevaporative getter pumps 3 and 41, power is distributed to the heaters 4 and 5 to heat the housing. It is possible to greatly improve the efficiency for rough exhausting by using the heat in the above case, opening the automatically opening/closing valve, and increasing a conductance. When activation and exhausting of the nonevaporative getter pumps are completed, power distribution to the heaters is stopped to cool the housing up to approximately room temperature. Because the lid 44 closes the opening 43 at approximately room temperature, the conductance between the lid 44 and the electron-gun column 10 is decided by the opening 42, and preferable differential exhausting is automatically realized. This embodiment can obtain a differential exhausting characteristic of a vacuum pressure of $10^{-8}$ Pa in the electron-gun column 10 which is four digits higher than the vacuum pressure of $10^{-4}$ Pa in the electronic-optical-system column 9.

The configuration described in this embodiment can greatly decrease the schematic dimensions of the whole electron gun to 15 cm in width and 15 cm in height when compared to a conventional configuration. Building up the electron gun and performing exhausting and baking achieves a vacuum pressure of $10^{-10}$ Torr. Moreover, applying 2 kV to the electron source and discharging electrons can keep a vacuum pressure of $10^{-10}$ Torr. Because a high vacuum pressure can be kept, a cold-cathode electron source (CFE) or a Schottky electron source may be used instead of the thermal field emission electron source used in this embodiment.

Furthermore, as a result of applying the electron gun of this embodiment to a scanning electron microscope having the structure shown in FIG. 3, it is possible to realize a scanning electron microscope having a size smaller than and a maintenance period longer than the scanning electron microscope described for the second embodiment, because the vacuum air tightness around the electron source is preferable.

Fifth Embodiment

This embodiment describes an electron gun with a positioning mechanism that realizes positioning more easily than that of the electron gun described in the fourth embodiment as follows.

Figure 7A:
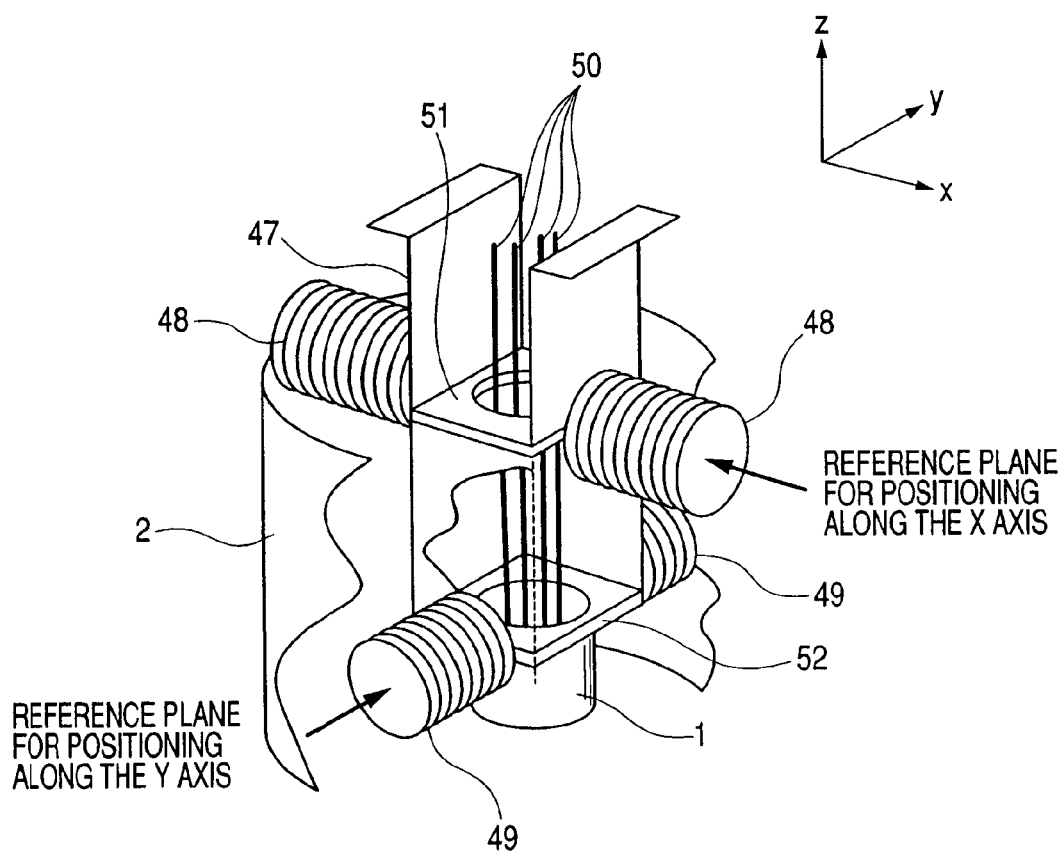
FIG. 7A is a theoretical diagram for explaining an electron-source positioning mechanism, in accordance with an embodiment of the present invention.
Figure 7B:
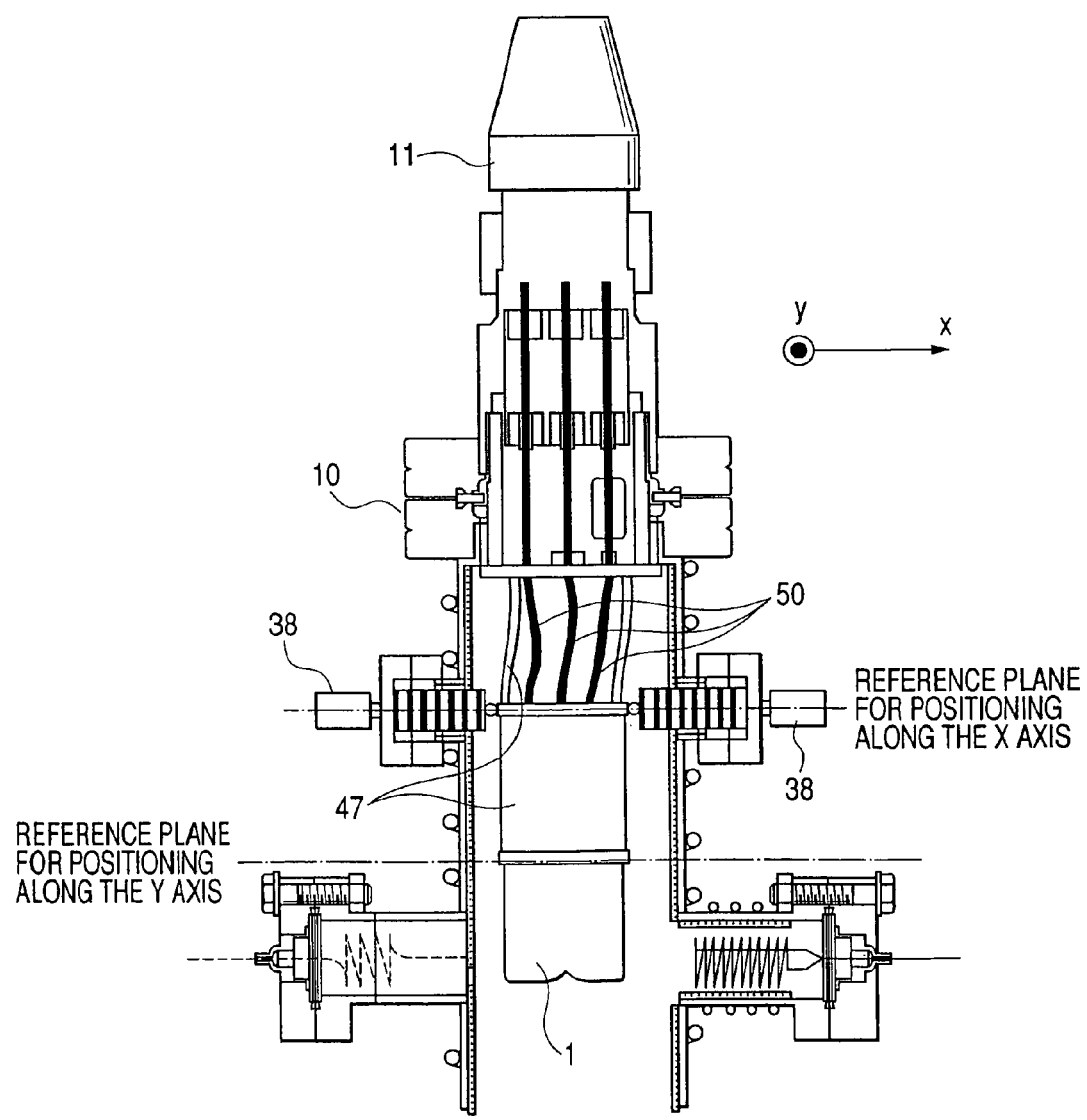
FIG. 7B is a structure in which an electron-source positioning mechanism is applied to an electron gun, in accordance with an embodiment of the present invention.

FIG. 7A shows a theoretical drawing of the positioning mechanism of this embodiment. FIG. 7B shows a block diagram when applying the positioning mechanism of this embodiment to the electron gun shown in FIG. 5 together with an essential portion of the electron gun.

First, the theory of this embodiment is described by referring to FIG. 7A. The positioning mechanism of this embodiment has a feature that an x-axis-directional reference plane is formed separately from a y-axis-directional reference plane. As described for the fourth embodiment, an electron source 1 is adjusted so that an electron beam transmitted to the column 9 is maximized for positioning. However, because a small charged-particle-beam applied apparatus cannot have a high-accuracy positioning mechanism, a user of the apparatus must manually perform adjustments. For the electron gun of the fourth embodiment, all electron-beam-source positioning knobs 38 are set at the same height. That is, positioning along the x and y axes must be performed at the same position. However, the electron gun in this embodiment independently has x-axis alignment device 48 and y-axis alignment device 49. Therefore, the user of the apparatus can initially adjust the x-directional or y-directional position and then perform appropriate positioning along the y or x axis. Therefore, the load of the user of the apparatus is decreased when adjusting the axis of the electron beam source.

FIG. 7B shows an important portion of the electron gun having the positioning mechanism of this embodiment. An electron source 1 is suspended in the electron-gun column 10 by a parallel plate spring 47 for holding the electron source 1 at a predetermined position in a vacuum vessel. Various electric wires 50 are held in the parallel plate spring. The upside of the parallel plate spring 47 is fixed to a flange having a feed-through and the electron source 1 is set to the lower end of the parallel plate spring 47. The electric wires 50 are insulated by insulators and led to the upper feed-through. The nonevaporative getter pump 2 surrounds the outer periphery of the parallel plate spring 47 so as to cover it. A stress from x direction and a stress from y direction are applied to the parallel plate spring 47 due to the operation of a positioning mechanism 48 or 49. That is, a torsion stress is applied to the parallel plate spring 47. Accordingly, it is necessary that the positioning mechanism 48 and 49 respectively have a rigidity to a torsion. Thus, this embodiment constitutes the positioning mechanisms 48 and 49 by using two pairs of lock-provided linear introduction terminals faced each other.

The drawing of the positioning mechanism shown in FIG. 7A shows a bellows used to introduce a linear motion from the outside of the electron gun housing. Moreover, the parallel plate spring 47 deforms by being distorted in x or y direction. However, the spring 47 has a large-enough rigidity and elastic modulus in the direction orthogonal to x or y direction and is designed so as not to cause buckling or plastic deformation. Note that fixing plates 51 and 52 for supporting the parallel plate spring 47 respectively have a high rigidity and elastic modulus against a force applied for positioning. A structure material other than a parallel plate spring may comprise the electron-source holding device as long as the material is a member not causing buckling or plastic deformation.

The parallel plate spring 47 has flat-spring fixing plates 51 and 52 forming axis-alignment reference planes in x and y directions. A pair of faced positioning mechanisms correspond to each plate and are combined with operation knobs 38 present at the outside of the housing of the electron-gun column 10 through the linear motion feed through. Thereby, a structure which can be operated from the atmospheric-air side is realized. To perform x-directional positioning, it is only necessary to operate an x-directional driving mechanism. The mechanism is preferable because a temporal drift can be reduced by fastening and locking an opposite driving mechanism when an x-directional position of the former mechanism is decided. Y-directional positioning may be performed basically the same as the case of the x-directional positioning.

By using the above structure, the electron source 1 can perform raster scanning not interfering in x or y direction. The electron source 1 can comprehensively efficiently move in a movable region of 1 mm×1 mm. The electron source 1 has a positioning feature such that an electron beam can be efficiently emitted through the opening 42. Another feature of the electron source 1 is that it may be easily downsized. Therefore, preferably both features can be coexistent.

Advantageously, a positioning mechanism can be simplified by applying the positioning mechanism of this embodiment to an electron gun having a structure other than that of the first embodiment, as long as the electron gun makes it possible to manually position an electron source.

Sixth Embodiment

This embodiment describes another configuration of the automatically opening/closing valve shown by symbol 102 in FIG. 5.

Figure 8A:
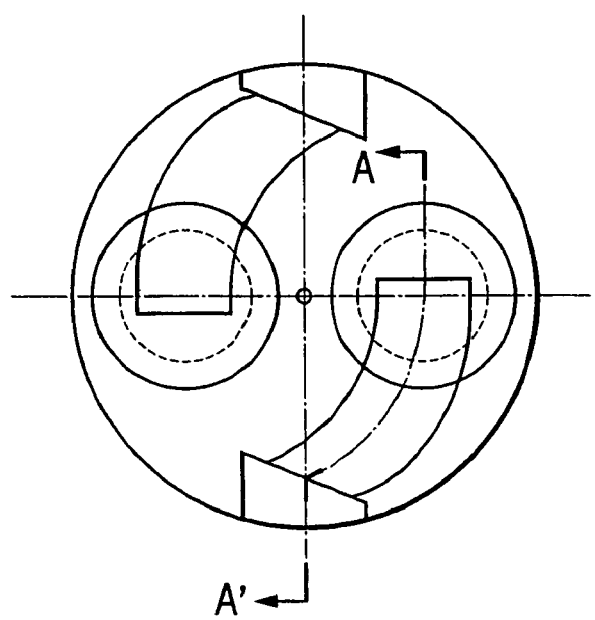
FIG. 8A shows another configuration of an automatically opening/closing valve, in accordance with an embodiment of the present invention.
Figure 8B:
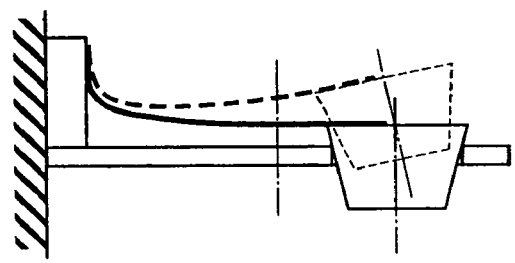
FIG. 8B shows still another configuration of an automatically opening/closing valve, in accordance with an embodiment of the present invention.
Figure 8C:
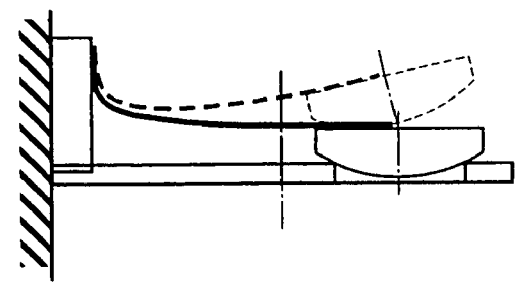
FIG. 8C shows still another configuration of an automatically opening/closing valve, in accordance with an embodiment of the present invention.
Figure 8D:
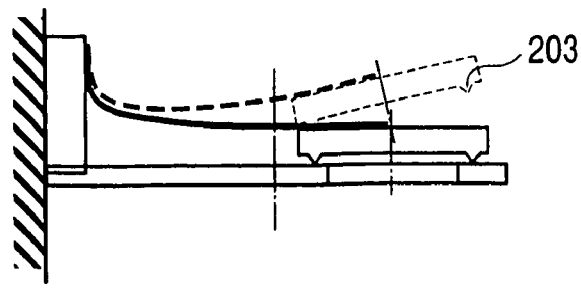
FIG. 8D shows still another configuration of an automatically opening/closing valve, in accordance with an embodiment of the present invention.

FIG. 8A is a top view of an opening plate 7 when viewed from its top, which is the same drawing as FIG. 6A. FIGS. 8B to 8*d* are cross-sectional views obtained by cutting the opening plate 7 and mounting various automatically opening/closing valves along the alternate long and short dash line shown at the position A'-A in FIG. 8A.

Characteristic points of the automatically opening/closing valves shown in FIGS. 8B to 8D are described below. The automatically opening/closing valve in FIG. 8B has a configuration in which a conical piece is used for a lid 44. The valve has an effect of preventing displacements of a hole and the valve due to opening/closing of the lid 44 (automatic aligning). The displacement of the above valve is a phenomenon due to a thermal deformation of the valve caused as a result of repeatedly opening/closing the valve accompanying a setting error of each component or temperature rise or fall. When the above valve displacement occurs, a problem occurs that the adhesiveness between an opening and the valve is deteriorated, gas enters through the gap between them, and a vacuum pressure is deteriorated. Therefore, sufficient consideration is necessary.

The automatically opening/closing valve shown in FIG. 8C has a configuration in which a contact face of the lid 44 with an opening 43 is formed into a sphere. The valve has an automatic aligning effect the same as the case of the valve shown in FIG. 8B. Moreover, because it is possible to use a general-purpose ball for the material of the lid 44, advantageously, the valve manufacturing cost may be reduced.

FIG. 8D shows a valve having a configuration in which a circular protrusion (circular edge) 203 is formed on the contact face between the lid 44 and the opening plate 7. By forming the circular edge on the lid 44, acceptable widths for displacements of a hole and the valve are increased. The same effect can be obtained even by forming the circular edge not at the lid-44 side but at the opening plate-7 side.

Automatically opening/closing valves having the configurations described by referring to FIGS. 8A to 8D improves the adhesiveness between the opening plate 7 and the lid 44 and therefore the vacuum air tightness in the electron-gun column 10.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A scanning electron microscope including an electron gun to generate an electron beam, an electronic optical system column holding a sample table and an electronic optical system that directs the electron beam to a sample held by the sample table, and an opening plate arranged at a boundary of the electron gun and the electronic optical system column and having an opening for passing the electron beam therethrough to the electronic optical system, the scanning electron microscope comprising:

a positioning device attached to the electron gun for adjusting a position of the electron beam with respect to the opening, the positioning device including first and second parallel-leaf springs that are combined in series, each of the first and second parallel-leaf springs including two parallel-plate springs that are fixed to opposing sides of the parallel-leaf spring.

2. The scanning electron microscope according to the claim 1, wherein the first parallel-leaf spring is configured to move in an x direction; and wherein the second parallel-leaf spring is configured to move in a y direction arranged at different position to the first parallel-leaf spring with respect to the longitudinal direction of the electron gun.

3. The scanning electron microscope according to the claim 2, wherein the first parallel-leaf spring includes a first two linear motion feedthroughs for adjusting the position of electron beam in the x direction, the first two linear motion feedthroughs facing each other and each having an edge fixed at the electron gun column, and wherein the second parallel-leaf spring includes a second two linear motion feedthroughs for adjusting the position of electron beam in the y direction, the second two linear motion feedthroughs facing each other and each being fixed at the electron gun column.

4. The scanning electron microscope according to the claim 3, wherein the first two linear motion feedthroughs have knobs for manually adjusting the position of electron beam in the x direction and for locking the first parallel-leaf spring against the electron gun column, and wherein the second two linear motion feedthroughs have knobs for manually adjusting the position of electron beam in the y direction and for locking the second parallel-leaf spring against the electron gun column.

5. The scanning electron microscope according to the claim 4, said electron gun further comprising:

first member forming x-axis-alignment reference plane attached to the first parallel-leaf spring;

second member forming y-axis-alignment reference plane attached the second parallel-leaf spring;

first linear motion feed through connecting the first two knobs and the first member; and second linear motion feed through connecting the second two knobs and the second member.

6. The scanning electron microscope according to the claim 1, wherein said opening plate is formed at a bottom of the electron gun.

* * * * *